(12) United States Patent
Breitung et al.

(10) Patent No.: US 7,781,031 B2
(45) Date of Patent: Aug. 24, 2010

(54) BARRIER LAYER, COMPOSITE ARTICLE COMPRISING THE SAME, ELECTROACTIVE DEVICE, AND METHOD

(75) Inventors: Eric Michael Breitung, New York, NY (US); Ahmet Gun Erlat, Clifton Park, NY (US); Larry Neil Lewis, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 393 days.

(21) Appl. No.: 11/567,308

(22) Filed: Dec. 6, 2006

(65) Prior Publication Data

US 2008/0138539 A1    Jun. 12, 2008

(51) Int. Cl.
*H05H 1/24* (2006.01)
*C23C 16/00* (2006.01)
(52) U.S. Cl. .................... 427/569; 427/248.1
(58) Field of Classification Search .......... None
See application file for complete search history.

(56) References Cited

U.S. PATENT DOCUMENTS

| | | | |
|---|---|---|---|
| 4,540,763 A | 9/1985 | Kirchhoff | |
| 5,185,391 A | 2/1993 | Stokich | |
| 5,753,374 A | 5/1998 | Camilletti et al. | |
| 6,277,448 B2 | 8/2001 | Strutt et al. | |
| 6,287,639 B1 | 9/2001 | Schmidt et al. | |
| 6,884,465 B2 | 4/2005 | Skarp et al. | |
| 6,926,572 B2 | 8/2005 | Park et al. | |
| 2002/0003403 A1 | 1/2002 | Ghosh et al. | |
| 2003/0168001 A1 | 9/2003 | Sneh | |
| 2004/0046497 A1 | 3/2004 | Schaepkens et al. | |
| 2004/0194691 A1 | 10/2004 | George et al. | |
| 2005/0112282 A1 | 5/2005 | Gordon et al. | |
| 2005/0172897 A1 | 8/2005 | Jansen | |
| 2005/0224935 A1 | 10/2005 | Schaepkens et al. | |

(Continued)

FOREIGN PATENT DOCUMENTS

EP    0560485 A1    9/1993

(Continued)

OTHER PUBLICATIONS

Erlat et al., Ultra high barrier coatings on polymer substrates for flexible optoelectronics: water vapor transport and measurement systems, Society of Vacuum Coaters, 2004, p. 654-659.*

(Continued)

*Primary Examiner*—Timothy Meeks
*Assistant Examiner*—Kelly M Gambetta
(74) *Attorney, Agent, or Firm*—Mary Louise Gioeni (57) ABSTRACT

A composite article comprising a substrate and method for making the composite article are provided. A barrier layer is disposed on at least one surface of the substrate, wherein the barrier layer comprises a barrier coating and at least one repair coating disposed on the barrier coating. The repair coating is a conformal coating and comprises a metal or a metal based compound. An electroactive device and in one particular embodiment a light emitting device comprising the composite article are also provided. In another embodiment the invention comprises a barrier layer disposed on at least one surface of a substrate; wherein the barrier layer comprises a barrier coating and at least one repair coating.

15 Claims, 4 Drawing Sheets

U.S. PATENT DOCUMENTS

2006/0001040 A1  1/2006  Kim et al.

FOREIGN PATENT DOCUMENTS

| WO | WO 2004/0105149 | | 12/2004 |
|---|---|---|---|
| WO | WO 2004105149 A1 | * | 12/2004 |
| WO | WO 2005/025853 A1 | | 3/2005 |

OTHER PUBLICATIONS da Silva Sobrinho et al.; "Defect-permeation Correlation for Ultrathin Transparent Barrier Coatings on Polymers"; J. Vac. Sci. Technol. A, 18(1), Jan./Feb. 2000; pp. 149-157.

Mikko Ritala et al.; "Atomic Layer Deposition"; Handbook of Thin Film Materials edited by H. S. Nalwa, (2002); vol. 1; chapter 2; pp. 103-159.

A.P. Roberts et al.; "Gas Permeation in Silicon-Oxide/Polymer (SiOx/PET) Barrier Films: Role of the Oxide Lattice, Nano-defects and Macro-defects"; Journal of Membrane Science, 208 (2002), pp. 75-88.

Masaaki Oda, Tomoyuki Abe, Toshihiro Suzuki, Norimichi Saito, Hisashi Iwashige, and Ghalip Kutluk; "Application of Dispersed Nano Particles"; Mat. Res. Soc. Symp. Proc., vol. 704 (2002), pp. 3-10.

Mika Yasuda et al.; "Self-healing Corrosion Protection Ability of Composition-Gradient $Al_2O_3$.Nb Nanocomposite Thin Films"; Journal of the Electrochemical Society, 150 (10) (2003); B481-B487.

M.E. Gross et al.; "Ultrabarrier Protective Coatings for Atmospherically Sensitive Thin-Film Electronic Devices"; 46th Annual Technical Conference Proceedings—Society of Vacuum Coaters (2003); pp. 89-92.

S. Tyagi et al.; "Using Nanocomposite Coatings to Heal Surface Defects"; Macromolecules, 2004, 37, (2004) pp. 9160-9168.

M. Schaepkens et al.; "Ultrahigh Barrier Coating Deposition on Polycarbonate Substrates"; J. Vac. Sci. Technol. A, 22(4), Jul./Aug. 2004; pp. 1716-1722.

A.G. Erlat et al.; "Ultra-high Barrier Coatings on Polymer Substrates for Flexible Optoelectronics—Water Vapour Transport and Measurement Systems"; 47th Annual Technical Conference Proceedings—Society of Vacuum Coaters (2004); pp. 654-659.

A.G. Erlat et al.; "Ultra-High Barrier Coatings for Flexible Organic Electronics"; 48th Annual Technical Conference Proceedings—Society of Vacuum Coaters (2005); pp. 116-120.

E. Barna et al.; "Innovative, Scratch Proof Nanocomposites for Clear Coatings"; Composites: Part A 36 (2005), pp. 473-480.

U.S. Appl. No. 11/446,077, filed Jun. 5, 2006.

Copending application Serial No.

* cited by examiner

BARRIER LAYER, COMPOSITE ARTICLE COMPRISING THE SAME, ELECTROACTIVE DEVICE, AND METHOD

BACKGROUND

The invention relates generally to barrier layers, composite articles comprising the barrier layers, and methods of making the same. The invention also relates to devices sensitive to chemical species and especially electroactive devices comprising the composite articles.

Electroactive devices such as electroluminescent (EL) devices are well-known in graphic display and imaging art. EL devices have been produced in different shapes for many applications and may be classified as either organic or inorganic. Organic electroluminescent devices, which have been developed more recently, offer the benefits of lower activation voltage and higher brightness, in addition to simple manufacture and thus the promise of more widespread applications compared to inorganic electroluminescent devices.

An organic electroluminescent device is typically a thin film structure formed on a substrate such as glass, transparent plastic, or metal foil. A light-emitting layer of an organic EL material and optional adjacent semiconductor layers are sandwiched between a cathode and an anode. Conventional organic electroluminescent devices are built on glass substrates because of a combination of transparency and low permeability to oxygen and water vapor. However, glass substrates are not suitable for certain applications in which flexibility is desired. Flexible plastic substrates have been used to build organic electroluminescent devices. However, the plastic substrates are not impervious to environmental factors such as oxygen, water vapor, hydrogen sulfide, $SO_x$, $NO_x$, solvents, and the like, resistance to which factors is often termed collectively as environmental resistance. Environmental factors, typically oxygen and water vapor permeation, may cause degradation over time and thus may decrease the lifetime of the organic electroluminescent devices in flexible applications. Previously, the issue of oxygen and water vapor permeation has been addressed by applying alternating layers of polymeric and ceramic materials over the substrate. The fabrication of such alternating layers of polymeric and ceramic materials requires multiple steps and hence is time consuming and uneconomical.

Therefore, there is a need to improve the environmental resistance of substrates in electroactive devices such as organic electroluminescent devices and to develop a method of doing the same, in a manner requiring a minimal number of processing steps.

BRIEF DESCRIPTION

According to one embodiment of the invention there is provided composite articles comprising: a substrate having a surface; and a barrier layer disposed on at least one surface of the substrate, wherein the barrier layer comprises a barrier coating and at least one repair coating disposed on the barrier coating, wherein the repair coating comprises a metal or a metal based compound, and wherein the repair coating is a conformal coating.

In another embodiment of the invention there is provided a method of making a composite article comprising the steps of: (i) providing a flexible substrate having a surface; (ii) depositing a barrier coating on at least one surface of the substrate; (iii) and forming a repair coating comprising at least one monolayer on the barrier coating by exposing the barrier coating to at least one deposition species in at least one atomic layer deposition process cycle.

In another embodiment of the invention there is provided a light emitting device comprising: a flexible, substantially transparent substrate having a surface; a barrier layer disposed on at least one surface of the substrate; and at least one organic electroluminescent layer disposed between two electrodes; wherein the barrier layer comprises a barrier coating and at least one repair coating disposed on the barrier coating, wherein the repair coating comprises a metal or a metal based compound deposited in an atomic layer deposition process.

In yet another embodiment of the invention there is provided a barrier layer disposed on at least one surface of a substrate; wherein the barrier layer comprises a barrier coating and at least one repair coating comprising a metal or a metal based compound deposited on the barrier coating in an atomic layer deposition process, wherein the barrier coating is selected from the group consisting of oxides, nitrides, carbides, and borides of elements of Groups IIA, IIIA, IVA, VA, VIA, VIIA, IB, IIB, metals of Groups IIIB, IVB, VB, rare earth elements, and any combination thereof; wherein the repair coating comprises either (i) zinc, cadmium, silicon, aluminum, germanium, copper, tungsten, titanium, or tantalum, or (ii) a metal halide, a metal oxide, a metal sulfide, a metal nitride, a metal carbide, a bimetallic compound, a trimetallic compound, or any combination thereof; and wherein the barrier layer has a water vapor transmission rate through the barrier layer of less than about $1\times10^{-2}$ g/m²/day, as measured at 25° C. and with a gas having 50 percent relative humidity.

BRIEF DESCRIPTION OF THE DRAWINGS

These and other features, aspects, and advantages of the present invention will become better understood when the following detailed description is read with reference to the accompanying drawings wherein.

DETAILED DESCRIPTION

In the following specification and the claims which follow, reference will be made to a number of terms which shall be defined to have the following meanings. The singular forms "a", "an" and "the" include plural referents unless the context clearly dictates otherwise. The phrases "environmental resistance" and "resistance to diffusion of chemical species" are used interchangeably.

According to one embodiment of the invention, a composite article is provided comprising a barrier layer disposed over a surface of a substrate. The barrier layer comprises a barrier coating in contact with the substrate and a repair coating disposed on the barrier coating. Composite articles having the repair coating on the barrier coating as described in embodiments of the invention have improved resistance to diffusion of chemical species and, hence, extended life, rendering them more commercially viable.

In some embodiments the substrate material may be flexible and/or substantially transparent. The substrate may be a single piece or a structure comprising a plurality of adjacent pieces of different materials. Illustrative substrate materials comprise organic polymeric resins such as, but not limited to, a polyethylene terephthalate (PET), a polyacrylate, a polynorbornene, a polycarbonate, a silicone, an epoxy resin, a silicone-functionalized epoxy resin, a polyester such as MYLAR® (available from E. I. du Pont de Nemours & Co.), a polyimide such as KAPTON® H or KAPTON® E (available from du Pont), APICAL® AV (available from Kaneka High-Tech Materials), UPILEX® (available from Ube Industries, Ltd.), a polyethersulfone, a polyetherimide such as ULTEM® (available from General Electric Company), a poly (cyclic olefin), or a polyethylene naphthalate (PEN). Other illustrative substrate materials comprise a glass, a metal or a ceramic. Combinations of substrate materials are also within the scope of the invention.

In certain embodiments additional layers may be disposed on the substrate prior to application of the barrier coating. In one embodiment of the invention a planarizing layer is provided on the substrate. The planarizing layer composition comprises at least one resin. In a further aspect of the invention the resin is an epoxy based resin. For example, the resin could be a cycloaliphatic epoxy resin such as, but not limited to, 3,4-epoxycyclohexylmethyl-3,4-epoxycyclohexylcarboxylate. Illustrative examples of cycloaliphatic epoxy resins include, but are not limited to, Dow ERL4221, ERL4299, ERLX4360, CYRACURE® UVR-6100 series and cycloaliphatic diepoxy disiloxanes such as those available from Silar Labs. The epoxy based resins may impart increased surface durability, for example, by improving resistance to scratch and damage that may likely happen during fabrication or transportation. Moreover, the siloxane portion of certain diepoxies may be easily adjusted in length and branching to optimize desired properties. In another aspect of the present invention, the resin is an acrylic based resin.

The planarizing layer composition may further comprise at least one flexibilizing agent, adhesion promoter, surfactant, catalyst or combinations thereof. A flexibilizing agent helps make the planarizing layer less brittle and more flexible by reducing the cracking or peeling and generally reducing the stress the coating applies to the underlying substrate. Illustrative examples of flexibilizing agents include, but are not limited to, Dow D.E.R.® 732 and 736, cyclohexane dimethanol, Celanese TCD alcohol DM, and King Industries K-FLEX® 148 and 188. An adhesion promoter may help to improve adhesion between the substrate and the barrier coating. For example, an adhesion promoter such as an organic silane coupling agent binds to the surface of the substrate and the subsequent barrier coating applied over the substrate. It is believed that a surfactant helps lower the surface energy of the barrier coating, allowing it to wet a substrate, and level better, providing a smoother, more uniform coating. Illustrative examples of surfactants include, but are not limited to, OSI SILWET® L-7001 and L-7604, GE SF1188A, SF1288, and SF1488, BYK-Chemie BYK®-307, and Dow TRITON® X.

In still another aspect of the present invention the planarizing layer may be cured. Illustrative curing methods include radiation curing, thermal curing, or combinations thereof. In one specific example, the radiation curing comprises ultraviolet (UV) curing. Other illustrative curing methods include anhydride or amine curing. Illustrative examples of UV curing agents include, but are not limited to, Dow CYRACURE® UVI-6976 and UVI-6992, Ciba IRGACURE® 250, and GE UV9380C. Non-limiting examples of thermal curing catalysts comprise King Industries CXC-162, CXC-1614, and XC-B220, and 3M FC520

Other optional additives can be incorporated into the planarizing layer to tailor its properties. Illustrative additives may comprise a UV catalyst, a UV absorber such as Ciba TINUVIN®, a UV sensitizer such as isopropylthioxanthone or ethyl dimethoxyanthracene, an antioxidant such as Ciba Geigy's IRGANOX® hindered amine complexes, and leveling agents such as BYK-Chemie BYK®-361. Siloxane additives can be included to make the planarizing layer more scratch resistant Illustrative barrier coating compositions comprise those selected from organic materials, inorganic materials, ceramic materials, and any combination thereof. In one example, these materials are recombination products derived from reacting plasma species and are deposited on the substrate surface. Organic barrier coating materials typically comprise carbon and hydrogen, and optionally other elements, such as oxygen, sulfur, nitrogen, silicon and like elements, depending on the types of reactants. Suitable reactants that result in organic compositions in the barrier coating comprise straight or branched alkanes, alkenes, alkynes, alcohols, aldehydes, ethers, alkylene oxides, aromatics, or like species, having up to about 15 carbon atoms. Inorganic and ceramic barrier coating materials typically comprise oxides, nitrides, borides, or any combinations thereof, of elements of Groups IIA, IIIA, IVA, VA, VIA, VIIA, IB or IIB; metals of Groups IIIB, IVB, or VB, or rare earth elements. For example, a barrier coating comprising silicon carbide can be deposited on a substrate by recombination of plasmas generated from silane and an organic material, such as methane or xylene. A barrier coating comprising silicon oxycarbide can be deposited from plasmas generated from silane, methane, and oxygen, or silane and propylene oxide, or from plasma generated from organosilicone precursors, such as tetraethoxy orthosilane (TEOS), hexamethyl disiloxane (HMDS), hexamethyl disilazane (HMDZ), or octamethyl cyclotetrasiloxane (D4). A barrier coating comprising silicon nitride can be deposited from plasmas generated from silane and ammonia. A barrier coating comprising aluminum oxycarbonitride can be deposited from a plasma generated for example from a mixture of aluminum tartrate and ammonia. Other combinations of reactants may be chosen to obtain a desired barrier coating composition. A graded composition of the barrier coating may be obtained by changing the compositions of the reactants fed into the reactor chamber during the deposition of reaction products to form the coating.

In other embodiments the barrier coating may comprise hybrid organic/inorganic materials or multilayer organic/inorganic materials. In still other embodiments the organic materials may comprise an acrylate, an epoxy, an epoxyamine, a siloxane, a silicone, or the like. In some embodiments barrier coatings comprising organic materials may be deposited using known methods such as, but not limited to, spin coating, flow coating, gravure or microgravure process, dip coating, spray coating, vacuum deposition, plasma enhanced chemical vapor deposition, or like methods. Metals may also be suitable for the barrier coating in applications where transparency is not required.

The thickness of the barrier coating is in one embodiment in the range from about 10 nanometers (nm) to about 10,000 nm, in another embodiment in the range from about 10 nm to about 1000 nm, and in still another embodiment in the range from about 10 nm to about 200 nm. It may be desirable to choose a barrier coating thickness that does not impede the transmission of light through the substrate. In one embodiment the reduction in light transmission is less than about 20 percent, in another embodiment less than about 10 percent, and in still another embodiment less than about 5 percent, compared to a substantially transparent substrate. In some embodiments the barrier coating does not affect the flexibility of the substrate.

The barrier coating may be formed on a surface of the substrate by one of many known deposition techniques, such as, but not limited to, plasma enhanced chemical vapor deposition (PECVD), radio frequency plasma enhanced chemical vapor deposition (RF-PECVD), expanding thermal-plasma chemical vapor deposition, reactive sputtering, electron-cyclotron-resonance plasma enhanced chemical vapor deposition (ECRPECVD), inductively coupled plasma enhanced chemical vapor deposition (ICPECVD), sputter deposition, evaporation, atomic layer deposition, or combinations thereof. In some embodiments the barrier coating may encapsulate either the substrate, or the substrate and one or more other layers comprising a composite article, or an electroactive device as described in embodiments of the invention.

The barrier coating obtained as described above may contain defects such as voids. Such voids may comprise pores, pinholes, cracks, and the like. The barrier coating may have a single defect or multiple defects. The defects may allow permeation of oxygen, water vapor, or other chemical species through an area of the defect. The infiltration of oxygen and water vapor through the barrier coating may damage a surface of the substrate, or may damage the barrier coating itself which may eventually damage the substrate, in either case resulting in damage to an electroactive device comprising the substrate. Minimizing the defects in the barrier coating may improve protection to the underlying substrate. Defects such as pinholes are typically deep and in some embodiments may extend across the thickness of the barrier coating, or in certain embodiments may just stop within the barrier coating. The pinhole defects that extend across the thickness of the barrier coating may expose the underlying substrate to attack by reactive species existing in the environment.

According to embodiments of the present invention at least one repair coating is disposed over the barrier coating of the barrier coated substrate using an atomic layer deposition (ALD) technique to minimize the defects in the barrier coating. Atomic layer deposition forms a conformal coating over the barrier coating and fills the defects in the barrier coating. As used herein the term "fill" implies filling or covering of the defects as well as coating of the defects. When filling defects in the barrier coating that penetrate to the substrate surface, the repair coating may be in contact with the substrate as well as with the barrier coating.

General methods for conducting ALD processes and the identities of various deposition species are well-known in the art, and are described, for example, by Mikko Ritala et al. in "Handbook of Thin Film Materials" edited by H. S. Nalwa, 2002, chapter 2, pp. 103-159. In one example the barrier coating disposed on at least one surface of the substrate is exposed sequentially to one or more atomic layer deposition species. In one embodiment individual deposition species are pulsed onto the surface in a sequential manner without mixing the deposition species. Each deposition species reacts at the barrier coating, optionally comprising a previous deposition species, to form a repair coating comprising an atomic layer in a way such that only one layer at a time can be deposited onto the coating. In the present context any repair coating is derived from one or more deposition species. Thus, in one embodiment an individual repair coating is derived from a single deposition species and in another embodiment the repair coating is derived from at least two deposition species.

Because the deposition species are all in the gas phase using the ALD process, the deposited repair coating may cover the exposed surfaces of the barrier coating even if those surfaces are not in the direct path of the deposition species. This is particularly advantageous to fill the defects such as pinholes in the barrier coating. Further, as the reactions are self-limiting each deposition species may form only a monolayer deposit on the surface of the barrier coating. Moreover, due to the conformal nature of atomic layer deposition a continuous film may be obtained.

A typical atomic layer deposition arrangement includes a process chamber which may be evacuated using processing pumps. In one embodiment the barrier coated substrate is fed into the process chamber using a continuous or semi-continuous roll-to-roll process. In one embodiment of the roll-to-roll process the process chamber is configured to enable the continuous movement of the barrier coated substrate for the purpose of performing an atomic layer deposition process on the barrier coating. Alternatively, the atomic layer deposition may be conducted using a batch process whereby the barrier coating disposed on at least one surface of the substrate is placed over a holder within the process chamber and the barrier coated substrate is subjected to atomic layer deposition.

An optional plasma source may be positioned within the process chamber. Use of the plasma source or other surface activation techniques such as, for example, use of electron beam, ultraviolet, ozone, or corona, may increase the reaction rate and may improve the quality of the deposition. Optionally, alternating current (AC) or direct current (DC) sputtering may be performed in conjunction with the ALD process.

In typical embodiments the barrier coated substrate is heated to assist in the ALD process. Any suitable technique for imparting heat into the process chamber should be sufficient. For example, one or more of the rollers or the substrate holders or both may be heated, or the deposition species may be pre-heated, or subjected to a heating process prior to being introduced into the process chamber. In other embodiments a heater may be provided to radiate heat in the process chamber. The heat sufficient for the atomic layer deposition process may be in a range of about room temperature (about 25° C.) to about 400° C., which is typically well below the melting temperature of the substrate.

The process chamber may include more than one subchamber so as to isolate the deposition species when more than one deposition species is employed. In one example, a first subchamber may provide for introduction of a first deposition species and a second or subsequent subchamber may provide for introduction of a second deposition species. A third subchamber may be positioned between the first subchamber and the second subchamber. A carrier gas such as an inert gas may be introduced into the process chamber through the third subchamber. The carrier gas may inhibit premature intermixing of the deposition species. In various embodiments any number of subchambers may be included. In some embodiments the number of subchambers depends on the number of deposition species. The various subchambers may include a plurality of rollers about which the barrier coated substrate is wound. Further, the subchambers may include a plurality of openings within walls of the subchambers to facilitate a roll-to-roll movement of the substrate.

In a typical run employing a roll-to-roll process, the barrier coated substrate may be wound over the plurality of rollers placed within the various subchambers. The rollers may be rotated at a desired speed so as to expose the barrier coated substrate to the deposition species for a period of time sufficient enough to saturate each deposition reaction. At the start of an atomic layer deposition cycle the barrier coated substrate is first exposed to the first deposition species. The first deposition species of the first subchamber may react at the barrier coating and may form a first repair coating over the barrier coating. In one embodiment the barrier coated substrate comprising the first repair coating is subsequently introduced to the third subchamber through the openings in the third subchamber by rotating the rollers. The carrier gas present in the third subchamber may remove any excess first deposition species that may be present on a surface of the first repair coating before introducing it to the second subchamber, thus inhibiting intermixing of the first deposition species with any second deposition species. Further, by adjusting a flow of the carrier gas the concentration of the deposition species may be controlled. The first repair coating may then be exposed to a second deposition species through an opening in the second subchamber. In one embodiment of a complete ALD cycle, the second deposition species may react at the first repair coating to complete formation of the repair coating. Any repair coating formed as a result of one ALD cycle may or may not be continuous. Also in some embodiments it is desirable to have a thicker coating than that provided by any first repair coating. To increase the thickness and/or the quality of any repair coating, more than one ALD cycle may be performed. In an illustrative example, in a second ALD cycle, any coated surface may be reintroduced to the third subchamber to remove excess second deposition species in contact with the first repair coating before exposing it to any further deposition species by the motion of the rollers about which it is wound. In the roll-to-roll process, the ALD cycles may be repeated by just moving the rollers so as to expose any repair coating sequentially to deposition species to form any desired thickness of any particular repair coating.

In some embodiments the process chamber includes a plurality of first subchambers, a plurality of second subchambers, and a plurality of third subchambers that are positioned between the plurality of first subchambers and the plurality of second subchambers, such that any barrier coated substrate is exposed to each of the deposition species from the desired subchambers sequentially to form a repair coating of any desired thickness and composition. Using such an arrangement the rate of deposition may be varied in any desired manner. In some embodiments a relative motion of the deposition species with respect to the substrate may be utilized to perform ALD. Further, modifications of the ALD processes are described, for example, in commonly owned application Ser. No. 11/446,077 filed on Jun. 5, 2006.

In various embodiments a roll-to-roll process requires a barrier coated substrate to be substantially flexible to roll over the rollers without any damage to the coating and the substrate. As used herein, the term "substantially flexible" means the substrate is being capable of being bent into any shape having a radius of curvature of less than approximately 100 centimeters.

The selection of deposition species may have a bearing on the adherence of the resultant repair coating to the barrier coating. In one embodiment at least one of the deposition species is one that may wet the barrier coating. If the barrier coating contains functional groups, the first deposition species may be chosen such that it may be reactive to the functional groups thereby forming a monolayer that is chemically bonded to the barrier coating, and may be capable of engaging in optional further deposition reactions to form the repair coating. When the barrier coating has no functional groups, an initial ALD deposition may be conducted to functionalize the surface of the barrier coating, and further ALD cycles may be conducted over the functionalized barrier coating to form the repair coating. Any monolayer that forms subsequent to a complete ALD cycle may be initially uneven due to the defects in the barrier coating until a number of ALD cycles have been completed.

A repair coating comprising a metal such as, but not limited to, zinc, cadmium, silicon, aluminum, germanium, copper, tungsten, titanium, or tantalum, or a metal-based compound such as, but not limited to, a metal halide, a metal oxide, a metal sulfide, a metal nitride, a metal carbide, or a bimetallic or trimetallic compound may be obtained by ALD reaction on the surface of the barrier coating using deposition species. Illustrative deposition species comprise a metal or a metal precursor such as, a metal halide, a metal alkyl compound, a metal alkoxide, a metal beta-diketonato compound, a metal cyclopentadienyl compound, a metal carboxylate, a metal hydride, a metal alkylamide or silylamide, or a bimetallic compound, or combinations thereof. Illustrative metal halides include, but are not limited to, halides of aluminum, gallium, indium, silicon, germanium, titanium, zirconium, hafnium, tantalum, molybdenum, tungsten, manganese, copper, zinc or cadmium. In one embodiment of an atomic layer deposition process the first deposition species may include a metal or a metal precursor described above, and the second deposition species may include a non-metal and/or other precursor that may react with the monolayer that results from the deposition of metal or metal precursor over the barrier coating. Illustrative non-metal and other precursors comprise sulfur, selenium, tellurium, water, oxygen, alcohol, ammonia, or a hydride or a sulfide of a non-metal. For example, a repair coating comprising alumina may be deposited on the barrier coating using a first deposition species comprising trimethyl aluminum (TMA), followed by a second deposition species comprising water, alcohol, or silanol, or combination thereof. The barrier coated substrate may be first exposed to gaseous TMA followed by purging with an inert gas, and subsequently exposed to vapors of water or alcohol to complete the ALD cycle. In another illustrative example a repair coating comprising silica nanolaminates may be provided by exposing the barrier coating to alternating deposition species such as catalytic compounds and then an alkoxysilanol, alkoxyalkylsilanol, or alkoxysilanediol compound. Suitable catalytic compounds comprise metal carboxylates or metal alcoholates such as, but not limited to, dibutyl tin dilaurate, dibutyl tin diacetate, titanium isopropoxide, zinc octoate, mixtures thereof, and the like.

In some embodiments of the present invention the repair coating comprises a monolayer structure and is continuous. In other embodiments the repair coating comprises a multilayered structure. The repair coating has a thickness in one embodiment in a range of about 0.1 nm to about 10,000 nm, in another embodiment in a range of about 1 nm to about 1000 nm, and in still another embodiment in a range of about 1 nm to about 200 nm. In still other embodiments the thickness of the repair coating is in a range of about 1 nm to about 20 nm. Single or multiple ALD cycles may be employed to prepare any desired thickness of repair coating.

In some embodiments the composite article comprising the substrate, the barrier coating, and the repair coating may be substantially transparent for applications requiring transmission of light. In the present context the term "substantially transparent" means allowing a transmission of light in one embodiment of at least about 50 percent, in another embodiment of at least about 80 percent, and in still another embodiment of at least about 90 percent of light in a selected wavelength range. The selected wavelength range can be in the visible region, infrared region, ultraviolet region, or any combination thereof of the electromagnetic spectrum, and in particular embodiments wavelengths can be in the range from about 300 nm to about 10 micrometers. In another particular embodiment the composite article exhibits a light transmittance of greater than about 80% and particularly greater than about 85% in a selected wavelength range between about 400 nm to about 700 nm.

In typical embodiments the composite article is flexible, and its properties do not significantly degrade upon bending. As used herein, the term "flexible" means being capable of being bent into a shape having a radius of curvature of less than about 100 centimeters.

Composite articles comprising substrate and barrier layer may be made by methods known in the art. In some embodiments composite articles may be made by a batch process, semi-continuous process, or continuous process. In one particular embodiment a composite article in embodiments of the invention may be made by a roll-to-roll process.

The composite article, according to embodiments of the invention, finds use in many devices or components such as, but not limited to, electroactive devices that are susceptible to reactive chemical species normally encountered in the environment. Illustrative electroactive devices comprise an electroluminescent device, a flexible display device including a liquid crystalline display (LCD), a thin film transistor LCD, a light emitting diode (LED), a light emitting device, an organic light emitting device (OLED), an optoelectronic device, a photovoltaic device, an organic photovoltaic device, an integrated circuit, a photoconductor, a photodetector, a chemical sensor, a biochemical sensor, a component of a medical diagnostic system, an electrochromic device, or any combination thereof. In another example the composite article as described in embodiments of the invention can advantageously be used in packaging of materials, such as food stuff, that are easily spoiled by chemical or biological agents normally existing in the environment.

Other embodiments of the invention comprise electroactive devices which comprise a composite article described in embodiments of the invention. In one illustrative example an electroactive device is a light emitting device comprising at least one organic electroluminescent layer sandwiched between two electrodes. The light emitting device further comprises a substrate and a barrier layer. The substrate may be flexible or substantially transparent, or both. The barrier layer comprises a barrier coating and a repair coating disposed on the barrier coating.

Figure 1:
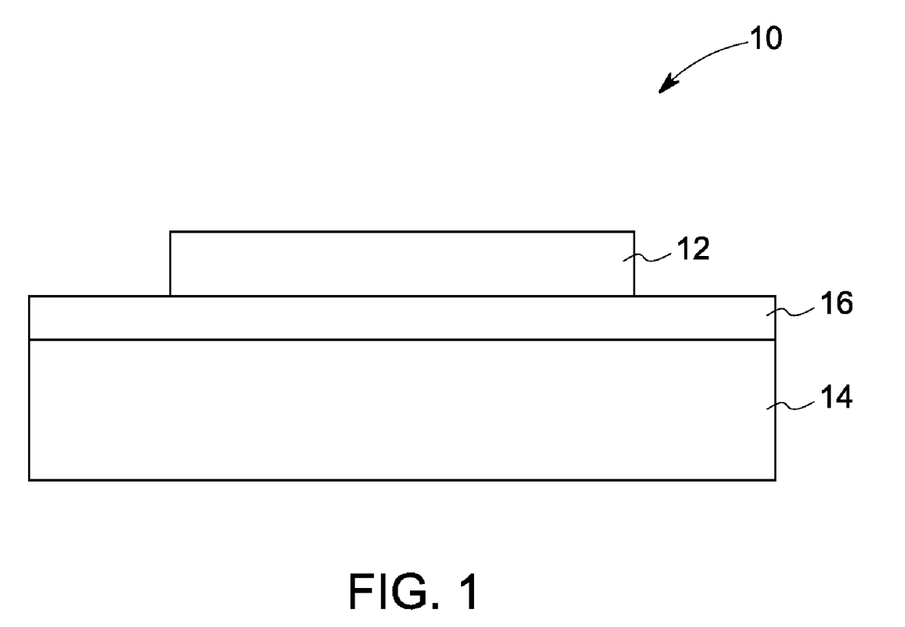
FIG. 1 shows a composite article comprising a barrier layer and a substrate layer according to one embodiment of the present invention.

FIG. 1 shows a composite article 10 in one embodiment of the invention. The composite article 10 comprises at least one organic electroluminescent layer 12 disposed on a substantially transparent substrate 14 and further comprises the barrier layer 16 disposed therein between as described in one embodiment above. The barrier layer 16 may be disposed or otherwise formed on either or both of the surfaces of the substrate 14 adjacent to the organic electroluminescent layer 12. In a particular embodiment the barrier layer 16 is disposed or formed on the surface of the substrate 14 adjacent to the organic electroluminescent layer 12. In other embodiments the barrier layer 16 may completely cover or encapsulate either the substrate 14 or the organic electroluminescent layer 12. In still other embodiments the barrier layer 16 may completely cover or encapsulate a composite article comprising a substrate 14 and the organic electroluminescent layer 12. In still other embodiments the barrier layer 16 may completely cover or encapsulate the device 10.

In a light emitting device comprising composite article 10, when a voltage is supplied by a voltage source and applied across the electrodes, light emits from the at least one organic electroluminescent layer 12. In one embodiment the first electrode is a cathode that may inject negative charge carriers into the organic electroluminescent layer 12. The cathode may be of a low work function material such as, but not limited to, potassium, lithium, sodium, magnesium, lanthanum, cerium, calcium, strontium, barium, aluminum, silver, indium, tin, zinc, zirconium, samarium, europium, alloys thereof, or the like, or mixtures thereof. The second electrode is an anode and is of a material having high work function such as, but not limited to, indium tin oxide, tin oxide, indium oxide, zinc oxide, indium zinc oxide, cadmium tin oxide, or the like, or mixtures thereof. The anode may be substantially transparent, such that the light emitted from the at least one organic electroluminescent layer 12 may easily escape through the anode. Additionally, materials used for the anode may be doped with aluminum species or fluorine species or like materials to improve their charge injection properties.

The thickness of the at least one organic electroluminescent layer 12 is typically in a range of about 50 nm to about 300 nm. The organic electroluminescent layer 12 may comprise a polymer, a copolymer, a mixture of polymers, or lower molecular weight organic molecules having unsaturated bonds. Such materials possess a delocalized pi-electron system, which gives the polymer chains or organic molecules the ability to support positive and negative charge carriers with high mobility. Mixtures of these polymers or organic molecules and other known additives may be used to tune the color of the emitted light. In some embodiments the organic electroluminescent layer 12 comprises a material selected from the group consisting of a poly(n-vinylcarbazole), a poly(alkylfluorene), a poly(paraphenylene), a polysilane, derivatives thereof, mixtures thereof, or copolymers thereof. In certain embodiments the organic electroluminescent layer 12 comprises a material selected from the group consisting of 1,2,3-tris[n-(4-diphenylaminophenyl)phenylaminobenzene, phenylanthracene, tetraarylethene, coumarin, rubrene, tetraphenylbutadiene, anthracene, perylene, coronene, aluminum-(picolylmethylketone)-bis[2,6-di(t-butyl)phenoxides], scandium-(4-methoxy-picolylmethylketone)-bis(acetylacetonate), aluminum acetylacetonate, gallium acetylacetonate, and indium acetylacetonate. More than one organic electroluminescent layer 12 may be formed successively one on top of another, each layer comprising a different organic electroluminescent material that emits in a different wavelength range.

Figure 2:
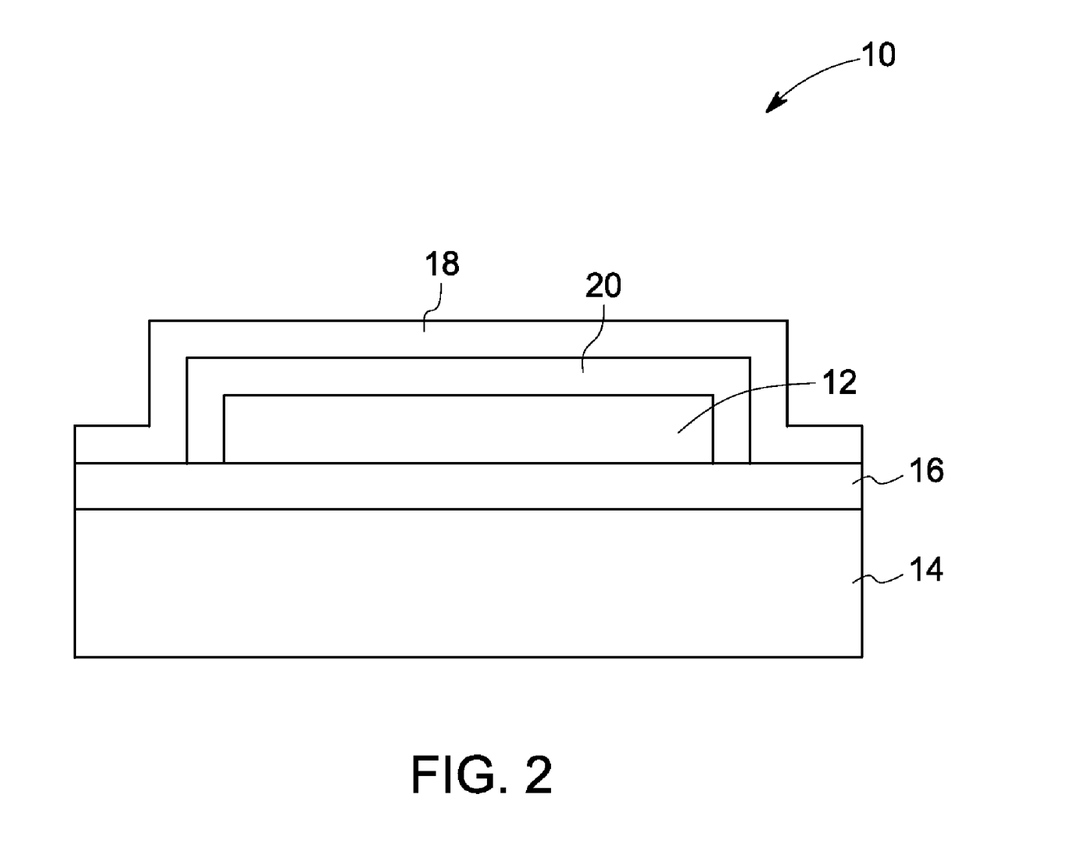
FIG. 2 shows a composite article comprising a barrier layer and a substrate layer and further comprising an organic electroluminescent layer according to another embodiment of the invention.

In some embodiments a reflective layer may be disposed on the organic electroluminescent layer to improve the efficiency of the device. Illustrative reflective layers comprise a material selected from the group consisting of a metal, a metal oxide, a metal nitride, a metal carbide, a metal oxynitride, a metal oxycarbide and combinations thereof. In other embodiments as shown in FIG. 2, a reflective metal layer 18 may be disposed on the organic electroluminescent layer 12 to reflect any radiation emitted from the substantially transparent substrate 14 and direct such radiation toward the substrate 14 such that the total amount of radiation emitted in this direction is increased. Suitable metals for the reflective metal layer 18 comprise silver, aluminum, alloys thereof, and the like. A barrier layer 16 may be disposed on either side of the substrate 14. It may be desired to dispose the barrier layer 16 adjacent to the organic electroluminescent layer 12. The reflective metal layer 18 also serves an additional function of preventing diffusion of reactive environmental elements, such as oxygen and water vapor, into the organic electroluminescent layer 12. It may be advantageous to provide a reflective layer thickness that is sufficient to substantially prevent the diffusion of oxygen and water vapor, as long as the thickness does not substantially reduce the flexibility of composite article 10. In one embodiment of the present invention one or more additional layers of at least one different material, such as a different metal or metal compound, may be formed on the reflective metal layer 18 to further reduce the rate of diffusion of oxygen and water vapor into the organic electroluminescent layer 12. In this case the material for such additional layer or layers need not be a reflective material. Compounds, such as, but not limited to, metal oxides, nitrides, carbides, oxynitrides, or oxycarbides, may be useful for this purpose.

In another embodiment of the composite article 10 an optional bonding layer 20 of a substantially transparent organic polymeric material may be disposed on the organic electroluminescent layer 12 before the reflective metal layer 18 is deposited thereon, also shown in FIG. 2. Examples of materials suitable for forming the organic polymeric layer comprise polyacrylates such as polymers or copolymers of acrylic acid, methacrylic acid, esters of these acids, or acrylonitrile; poly(vinyl fluoride); poly(vinylidene chloride); poly(vinyl alcohol); a copolymer of vinyl alcohol and glyoxal (also known as ethanedial or oxaldehyde); polyethylene terephthalate, parylene (thermoplastic polymer based on p-xylene), and polymers derived from cycloolefins and their derivatives (such as poly(arylcyclobutene) disclosed in U.S. Pat. Nos. 4,540,763 and 5,185,391. In one embodiment the bonding layer 20 material is an electrically insulating and substantially transparent polymeric material.

Figure 3:
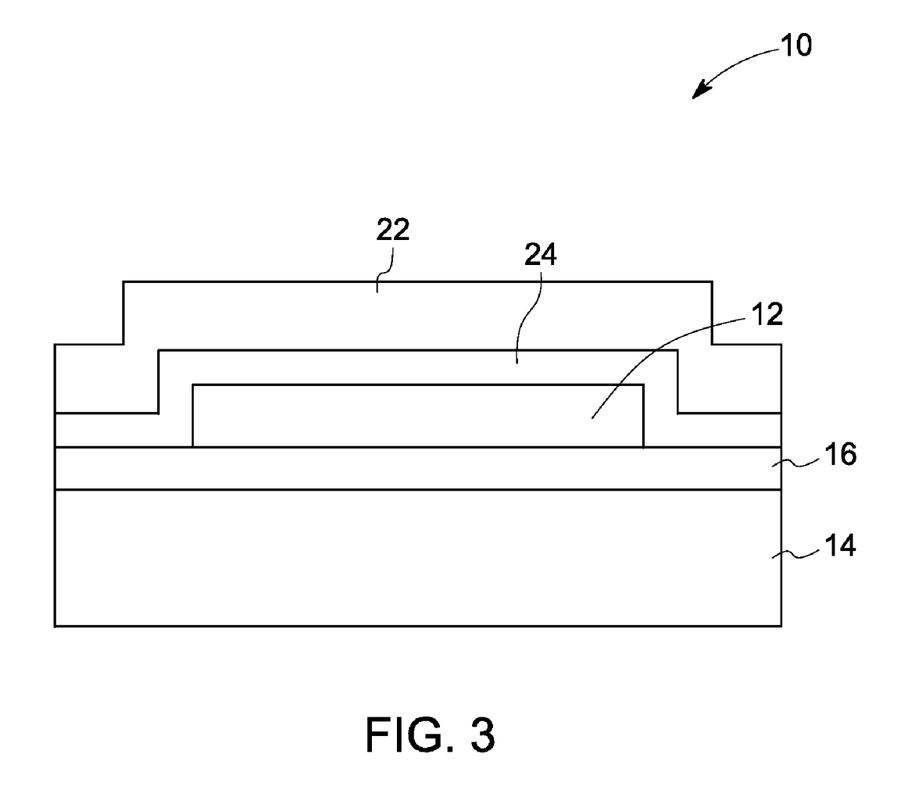
FIG. 3 shows a composite article comprising a barrier layer and a substrate layer and further comprising an organic electroluminescent layer in yet another embodiment of the invention.

In another embodiment of the composite article 10 of the present invention a second barrier layer 24 is disposed on the organic electroluminescent layer 12 on the side away from the first substrate 14 to form a complete seal around the organic electroluminescent layer 12, as shown in FIG. 3, wherein the second barrier layer 24 is disposed between a second substrate layer 22 and the electroluminescent layer 12. In some embodiments the second substrate 22 may comprise a polymeric material and particularly an organic polymeric material. The first barrier layer 16 may be disposed on either side of the first substrate 14. In one embodiment the first barrier layer 16 is disposed in contact with the organic electroluminescent layer 12. In an alternative embodiment a reflective metal layer 18 may be disposed between the second barrier layer 24 and the organic electroluminescent layer 12 to provide even more protection to organic electroluminescent layer 12, wherein the order of layers in a modified embodiment of FIG. 3 comprises, respectively, second substrate 22, second barrier layer 24, reflective metal layer 18, organic electroluminescent layer 12, first barrier layer 16, and first substrate 14. An optional bonding layer 20 may be present between reflective metal layer 18 and electroluminescent layer 12. In another embodiment the second barrier layer 24 may be deposited directly on the organic electroluminescent layer 12 instead of being disposed on a second substrate 22. In this case, the second substrate 22 may be eliminated. In still another embodiment the second substrate 22 having the second barrier layer 24 can be disposed between organic electroluminescent layer 12 and a reflective metal layer 18, wherein the second substrate 22 is in contact with the reflective metal layer 18 and the second barrier layer 24 is in contact with the electroluminescent layer 12. An optional bonding layer 20 may be present between layers, for example between electroluminescent layer 12 and second barrier layer 24. This configuration may be desirable when it can offer some manufacturing or cost advantage, especially when the transparency of coated substrate is also substantial. The first barrier layer 16 and the second barrier layer 24 may be the same or different. The first substrate 14 and the second substrate 22 may be the same or different.

Figure 4:
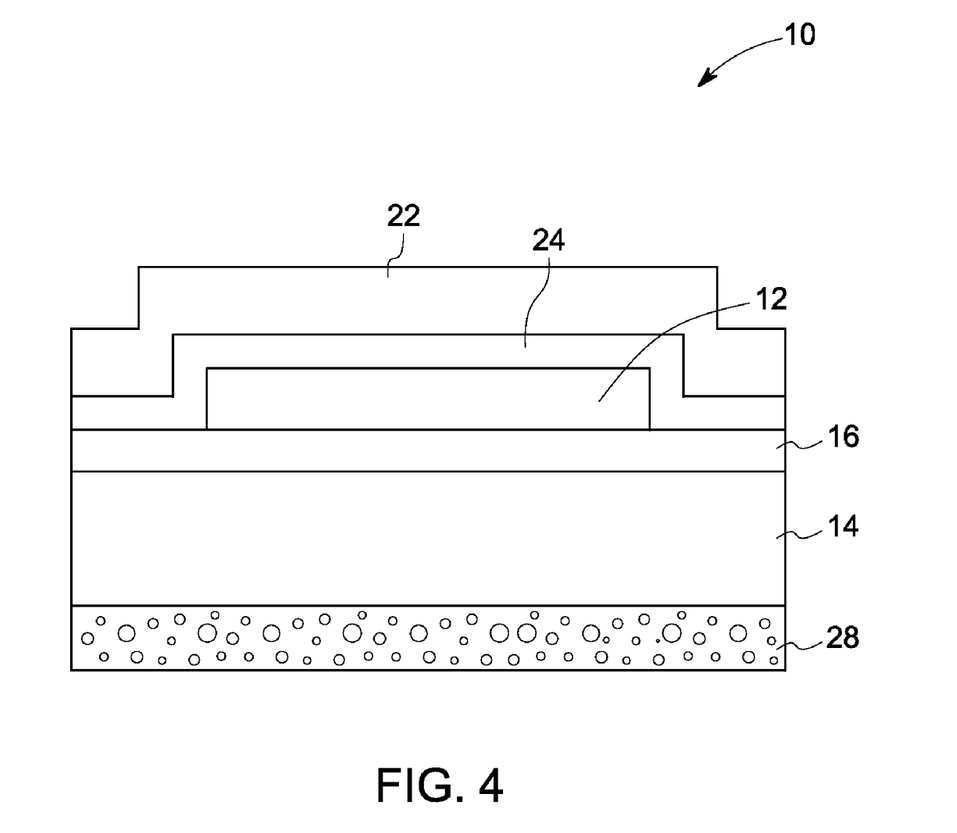
FIG. 4 shows a composite article comprising a barrier layer and a substrate layer and further comprising a light scattering layer according to yet another embodiment of the invention.

In another embodiment, as shown in FIG. 4, the composite article 10 may further comprise a light scattering layer 28 disposed in the path of light emitted from a light emitting device comprising the composite article 10, and also comprising first substrate 14, first barrier layer 16, organic electroluminescent layer 12, second barrier layer 24, and second substrate 22. An optional bonding layer 20 may be present between layers, for example between electroluminescent layer 12 and second barrier layer 24. The light scattering layer 28 typically comprises scattering particles of size in the range of from about 10 nm to about 100 micrometers. The scattering particles may be advantageously dispersed in a substantially transparent matrix disposed on the composite article. Illustrative light scattering materials comprise rutile, hafnia, zirconia, zircon, gadolinium gallium garnet, barium sulfate, yttria, yttrium aluminum garnet, calcite, sapphire, diamond, magnesium oxide, germanium oxide, or mixtures thereof. In some embodiments the light scattering layer 28 further comprises a photoluminescent material mixed with the scattering particles. The inclusion of such a photoluminescent material may provide a tuning of color of light emitted from a light emitting device comprising composite article 10. Many micrometer sized particles of oxide materials, such as zirconia, yttrium and rare-earth garnets, and halophosphates or like materials may be used. Illustrative photoluminescent material may be selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$; $Ca_8Mg(SiO_4)_4Cl_2:Eu^{2+},Mn^{2+}$; $GdBO_3:Ce^{3+},Tb^{3+}$; $CeMgAl_{11}O_{19}:Tb^{3+}$; $Y_2SiO_5:Ce^{3+},Tb^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn^{2+}$; $SrMgP_2O_7:Eu^{2+},Mn^{2+}$; $(Y,Gd)(V,B)O_4:Eu^{3+}$; $3.5MgO\ 0.5MgF_2\ GeO_2:Mn^{4+}$ (magnesium fluorogermanate); $BaMg_2Al_{16}O_{27}:Eu^{2+}$; $Sr_5(PO_4)_{10}Cl_2:Eu^{2+}$; $(Ca,Ba,Sr)(Al,Ga)_2S_4:Eu^{2+}$; $(Ca,Ba,Sr)_5(PO_4)_{10}(Cl,F)_2:Eu^{2+},Mn^{2+}$; $Lu_3Al_5O_{12}:Ce^{3+}$; $Tb_3Al_5O_{12}:Ce^{3+}$; and mixtures thereof; wherein $0 \leq x \leq 1$, $0 \leq y \leq 1$, $0 \leq z \leq 5$ and $x+y \leq 1$. In some embodiments the light scattering layer 28 further comprises at least one organic photoluminescent material capable of absorbing at least a portion of electromagnetic radiation emitted by the organic electroluminescent layer 12 and emitting electromagnetic radiation in the visible range.

Furthermore, one or more additional layers may be included in any light emitting device comprising composite article 10 between one of the two electrodes and the organic electroluminescent layer 12 to perform at least one function selected from the group consisting of electron injection enhancement, hole injection enhancement, electron transport enhancement, and hole transport enhancement.

Barrier layers comprising barrier coating with repair coating in embodiments of the invention typically exhibit barrier properties which comprise a low water vapor transmission rate and a low oxygen transmission rate. In some embodiments barrier layers of the invention have a water vapor transmission rate in one embodiment of less than about $1 \times 10^{-2}$ grams per square meter per day (g/m²/day), and in another embodiment of less than about $1 \times 10^{-4}$ g/m²/day, as measured at 25° C. and with a gas having 50 percent relative humidity. Barrier layers of the invention have an oxygen transmission rate in one embodiment of less than about 0.1 cubic centimeters per square meter per day (cm³/m²/day), in another embodiment of less than about 0.5 cm³/m²/day, and in still another embodiment of less than about 1 cm³/m²/day as measured at 25° C. and with a gas containing 21 volume percent oxygen. In some embodiments the barrier layers were tested for their barrier properties using at least one of two tests, a direct calcium test and an edge seal calcium test. Both these tests are based on the reaction of calcium with water vapor and are described, for example, by A. G. Erlat et al. in "47th Annual Technical Conference Proceedings—Society of Vacuum Coaters", 2004, pp. 654-659, and by M. E. Gross et al. in "46th Annual Technical Conference Proceedings—Society of Vacuum Coaters", 2003, pp. 89-92. In a representative embodiment of the direct calcium test, a test sample is prepared by depositing a calcium layer over a substrate having a dimension of about 2.5 cm by 2.5 cm inside a glovebox having a specified water content of less than about 1 part per million and an oxygen content of less than about 5 parts per million. A barrier layer may be present between the substrate and calcium layer. The calcium layer is 100 nanometers thick with a diameter of about 9.5 millimeters. The test sample is sealed with a glass cover slip using a UV curable epoxy such as, ELC2500® (from Electro-Lite Corporation). The sealed test sample is removed from the glovebox and is placed in an automated imaging system for imaging and measuring the initial optical density. The test sample is imaged at every regular intervals over a period of time to evaluate the barrier performance of the substrate. In between measurements, the test sample is stored in an environmental chamber having a relative humidity of about 90%, at a temperature of about 60° C. The water vapor permeates through the defects in the substrate and comes in contact with the calcium layer to form calcium hydroxide in localized regions, and these localized regions expand laterally as a function of time which are recorded as multiple images spanning over the period of time. The slower the calcium is consumed, the better the barrier properties. Test samples having different barrier layers may be compared for barrier performance using this method by comparing the amount of time the barrier coating lasted and the area of calcium layer consumed during this period. The detection limit using this test is more than about 1500 hours.

In a representative embodiment of the edge seal calcium test, a calcium test cell is fabricated by evaporating a 50 nm thick calcium layer on top of a cleaned, 50 millimeter (mm) by 75 mm glass slide. The glass slide is then sealed using an epoxy to a second clean glass slide in an argon glove box. In some embodiments the glass slide is sealed to the substrate having the barrier layer. In the edge seal calcium test the barrier layer is provided on the opposite side of the second clean glass surface such that the barrier layer is not in contact with the calcium coating. The barrier layer is not in direct contact with the calcium surface as they are separated using an epoxy layer along the sides of the glass. The calcium test cell is placed between a light emitting diode (LED) source and a photodetector in a temperature and humidity controlled environment. The test is conducted at 23° C. at a relative humidity of 50%. As oxygen and water vapor permeate through the substrate, the calcium within the cell reacts to form oxide and hydroxide, respectively. As water permeation progresses, the calcium layer becomes thinner and transparent, thus lowering the optical density. The light transmission is continuously measured at a wavelength of 880 nm, and the change in optical density as a function of time can be used to calculate the water vapor transmission rate which is a measure of barrier properties. The detection limit using this method is as low as about $10^{-6}$ g/m²/day to about $10^{-5}$ g/m²/day, and this value is to a certain extent determined by the effectiveness of the edge epoxy seal used as a separation between the barrier layer and the calcium.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

COMPARATIVE EXAMPLE 1

This example serves to illustrate the fabrication of a reference sample. A polycarbonate substrate with a planarizing layer on opposing surfaces of the polycarbonate substrate was prepared. The planarizing layer comprised 3,4-epoxycyclohexylmethyl-3,4-epoxycyclohexylcarboxylate (CY). A barrier coating was formed on one side of the polycarbonate substrate and over the planarizing layer by plasma coating a layer of silicon nitride. The barrier property of the silicon nitride coated substrate was measured using an edge seal calcium test and showed a water vapor transmission rate (WVTR) in grams per square meter per day (g/m²/day) at 23° C. and 50% relative humidity (RH) of 2.50E-04.

EXAMPLE 1

This example serves to illustrate the fabrication of a coated substrate in accordance with some embodiments of the present invention. A polycarbonate substrate (PC) of about 15.2 centimeters (cm) to about 16.5 cm long and a width of about 2.5 cm was coated with CY on opposing surfaces of the polycarbonate substrate to form a planarizing layer. A barrier coating was formed on one side of the polycarbonate substrate and over the planarizing layer by plasma coating a layer of silicon nitride. The silicon nitride coated substrate was mounted on an aluminum mounting plate after blowing it with nitrogen to remove any adhering impurities. The silicon nitride coated substrate was then introduced into an ALD chamber and repair coating was applied using different cumulative exposure times to trimethyl aluminum and silanol to form a repair coating comprising $SiO_xAl_yO_z$. First, the silicon nitride coated substrate was exposed to trimethyl aluminum at a temperature of about 120° C. with substrate holder at a temperature of 191° C. The trimethyl aluminum was pulsed 2 times for 0.5 seconds each. Next, a container containing tris (tert-butoxy)silanol was opened into the deposition chamber for 15 seconds. The ALD chamber was then purged with nitrogen for about 240 seconds. The coated substrate was removed from the ALD chamber, and the thickness of the repair coating was measured and was found to be about 10 nanometers. The ALD cycle was repeated 2 to 6 times using fresh silicon nitride coated substrates to prepare individual samples with increasing thickness of the repair coating. Each coated substrate was removed from the ALD chamber, and the thickness of the repair coating was measured. Individual control samples showed no barrier properties when the repair coating was deposited in various thicknesses on CY or polycarbonate or polyamide without the accompanying SiN barrier coating. When the repair coating was deposited on the SiN barrier coated substrate, the repair coated samples outperformed separate control samples lacking the repair coating. More particularly, the best control sample lacking a repair coating endured only 192 hours of Direct Ca-test. The repair coated samples at 10, 20, 40, and 60 nm thickness endured over 622 hours on the same calcium test. At 622 hours, at least 25% of the calcium remained on each of the repair coated samples with the 60 nm repair coated sample having a thicker (darker) area of calcium than the 10 nm repair coated sample.

EXAMPLE 2

Cy/PC/Cy and Cy/PC/Cy/SiN samples were taped to 10.2 centimeter diameter silicon wafers. Some samples were treated with UV-ozone. All samples were first blown free of particles using nitrogen or an air can. Once free of particles, each sample was placed in the reactor and degassed under vacuum at 150° C. for 1 hour. A 10 minute degassing was determined to be insufficient. The reactor temperature was maintained at 150° C., and the alternate deposition of trimethyl aluminum followed by water to form a repair coating comprising $Al_yO_z$ was completed with 10 second flow of nitrogen at 20 sccm between each precursor. Both trimethyl aluminum and water were mixed with a stream of 20 sccm nitrogen to keep the computer automated valves clear of reactive residues that would eventually form a plug of oxide. After the appropriate thickness was deposited, the reactor was not allowed to cool before removing the sample. A series of samples were deposited this way ranging from 10 to 60 nm. Table 1 shows the data for samples having repair coating thicknesses of 10 nm and 60 nm. Individual control samples showed poorer barrier properties when the repair coating was deposited in various thicknesses on CY without the accompanying SiN barrier coating.

TABLE 1

| Repair Coating Thickness | WVTR (g/m$^2$/day) at 23° C. and 50% RH |
|---|---|
| 10 nm | 7.80E−05 |
| 60 nm | 5.60E−05 |

While only certain features of the invention have been illustrated and described herein, many modifications and changes will occur to those skilled in the art. It is, therefore, to be understood that the appended claims are intended to cover all such modifications and changes as fall within the true spirit of the invention. All Patents and published articles cited herein are incorporated herein by reference.

The invention claimed is:

1. A method of making a composite article comprising the steps of:
   (i) providing a flexible substrate having a surface;
   (ii) depositing a barrier coating on at least one surface of the substrate using plasma enhanced chemical vapor deposition, radio frequency plasma enhanced chemical vapor deposition, expanding thermal plasma-enhanced chemical vapor deposition, sputtering, reactive sputtering, electron cyclotron resonance plasma-enhanced chemical vapor deposition, inductively coupled plasma-enhanced chemical vapor deposition, evaporation, or any combination thereof;
   (iii) and forming a repair coating comprising at least one monolayer on the barrier coating by exposing the barrier coating to at least one deposition species in at least one atomic layer deposition process cycle;
   wherein the barrier coating and the repair coating comprise different materials.

2. The method of claim 1, wherein more than one atomic layer deposition process cycle is performed.

3. The method of claim 1, wherein the deposition species comprises metal precursors, non-metal precursors, or any combination thereof.

4. The method of claim 1, wherein the at least one monolayer is chemically bonded to the barrier coating.

5. The method of claim 1, wherein the repair coating comprises a metal or a metal based compound.

6. The method of claim 1, which further comprises providing a planarizing layer on the substrate.

7. The method of claim 1, which employs a roll-to-roll process.

8. The method of claim 1, wherein the barrier coating is selected from the group consisting of oxides, nitrides, carbides, and borides of elements of Groups IIA, IIIA, WA, VA, VIA, VIIA, IB, IIB, metals of Groups IIIB, IVB, VB, rare earth elements, and any combination thereof.

9. The method of claim 8, wherein the repair coating comprises either (i) zinc, cadmium, silicon, aluminum, germanium, copper, tungsten, titanium, or tantalum, or (ii) a metal halide, a metal oxide, a metal sulfide, a metal nitride, a metal carbide, a bimetallic compound, a trimetallic compound, or any combination thereof.

10. The method of claim 8, wherein the barrier coating comprises a nitride.

11. The method of claim 10, wherein the repair coating comprises a metal oxide.

12. The method of claim 1, wherein a surface of the substrate comprises a planarizing layer.

13. The method of claim 12, wherein the planarizing layer comprises an epoxy resin.

14. The method of claim 13, wherein the epoxy resin comprises a cycloaliphatic epoxy resin.

15. The method of claim 12, wherein the planarizing layer further comprises at least one flexibilizing agent, adhesion promoter, surfactant, catalyst, or combinations thereof.

* * * * *

UNITED STATES PATENT AND TRADEMARK OFFICE
CERTIFICATE OF CORRECTION

PATENT NO.        : 7,781,031 B2                                                                Page 1 of 1
APPLICATION NO.   : 11/567308
DATED             : August 24, 2010
INVENTOR(S)       : Breitung et al.

It is certified that error appears in the above-identified patent and that said Letters Patent is hereby corrected as shown below:

In Column 16, Line 28, in Claim 8, delete "WA," and insert -- IVA, --, therefor.

Signed and Sealed this

Twenty-sixth Day of October, 2010

David J. Kappos
*Director of the United States Patent and Trademark Office*